(12) United States Patent
Spivak (10) Patent No.: US 10,653,002 B2
(45) Date of Patent: May 12, 2020

(54) ACTIVELY SENSING AND CANCELLING VIBRATION IN A PRINTED CIRCUIT BOARD OR OTHER PLATFORM

(71) Applicant: Honeywell International Inc., Morris Plains, NJ (US)

(72) Inventor: Alexander Spivak, Sammamish, WA (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/049,658

(22) Filed: Jul. 30, 2018

(65) Prior Publication Data

US 2020/0037441 A1   Jan. 30, 2020

(51) Int. Cl.
| | | |
|---|---|---|
| *F16F 15/00* | (2006.01) | |
| *F16F 15/02* | (2006.01) | |
| *F01D 5/14* | (2006.01) | |
| *F01D 5/16* | (2006.01) | |
| *B25J 9/16* | (2006.01) | |
| *H05K 1/02* | (2006.01) | |
| *H05K 1/11* | (2006.01) | |

(52) U.S. Cl.
CPC .......... *H05K 1/0271* (2013.01); *H05K 1/028* (2013.01); *H05K 1/115* (2013.01); *H05K 2201/095* (2013.01); *H05K 2201/10151* (2013.01)

(58) Field of Classification Search
CPC .......... F16F 15/00; F16F 15/02; F16F 15/005; F01D 5/14; F01D 5/16; B25J 9/16

USPC ........ 361/749; 248/550, 562, 636, 637, 638; 62/6; 73/11.07; 335/231; 408/143; 416/145
See application file for complete search history.

(56) References Cited

U.S. PATENT DOCUMENTS

| | | | | |
|---|---|---|---|---|
| 4,107,975 A | * | 8/1978 | Cargile | .................... G01B 7/14 73/11.07 |
| 4,643,385 A | * | 2/1987 | Sandercock | .......... F16F 15/005 248/550 |
| 5,136,470 A | | 8/1992 | Sheridon et al. | |
| 5,504,940 A | | 4/1996 | Hahs, Jr. et al. | |
| (Continued) | | | | |

OTHER PUBLICATIONS

"Active Noise Control", Wikipedia, May 1, 2018, pp. 13.
(Continued)

*Primary Examiner* — Xiaoliang Chen
(74) *Attorney, Agent, or Firm* — Fogg & Powers LLC (57) ABSTRACT

An embodiment of an assembly includes a platform (e.g., a printed circuit board (PCB)), a sensor, and a vibration-cancel circuit. The sensor is mounted to the platform and is configured to generate a sense signal that represents a vibration induced (e.g., a shock-induced vibration) in the platform. And the vibration-cancel circuit is configured to reduce or eliminate a level of the vibration in response to the sense signal. For example, such a vibration-cancel circuit is configured to reduce a magnitude of a vibration induced in platform, or to eliminate the vibration altogether, by generating, in the platform, a counter vibration that has a magnitude approximately equal to the magnitude of the induced vibration and that has a phase approximately opposite to the phase of the induced vibration. That is, the counter vibration cancels the induced vibration to reduce the net vibration that the platform experiences.

18 Claims, 7 Drawing Sheets

(56) References Cited

U.S. PATENT DOCUMENTS

| | | | | |
|---|---|---|---|---|
| 5,612,670 | A * | 3/1997 | Snyder | B60R 25/1007 |
| | | | | 200/52 A |
| 5,659,271 | A * | 8/1997 | Tanabe | H03L 1/00 |
| | | | | 331/10 |
| 5,757,580 | A * | 5/1998 | Andress | G11B 33/121 |
| | | | | 360/99.19 |
| 5,811,821 | A * | 9/1998 | Alexander | F16F 15/02 |
| | | | | 248/550 |
| 5,822,193 | A | 10/1998 | Summers et al. | |
| 6,022,005 | A * | 2/2000 | Gran | F16F 15/005 |
| | | | | 244/164 |
| 6,029,959 | A * | 2/2000 | Gran | F16F 15/005 |
| | | | | 188/378 |
| 6,299,410 | B1 * | 10/2001 | Hilbert | F01D 5/16 |
| | | | | 415/10 |
| 7,719,416 | B2 | 5/2010 | Arms et al. | |
| 8,776,342 | B2 * | 7/2014 | Kuo | B23Q 17/12 |
| | | | | 29/407.07 |
| 9,013,961 | B1 * | 4/2015 | Nicholson | A01M 29/22 |
| | | | | 367/139 |
| 10,226,792 | B2 * | 3/2019 | Houston | B06B 1/166 |
| 2002/0007677 | A1 | 1/2002 | Coates et al. | |
| 2002/0046604 | A1 * | 4/2002 | Ishikawa | G01C 19/5719 |
| | | | | 73/504.12 |
| 2002/0085275 | A1 * | 7/2002 | Takano | G02B 7/12 |
| | | | | 359/407 |
| 2005/0109914 | A1 * | 5/2005 | Ryaboy | F16F 7/1011 |
| | | | | 248/637 |
| 2007/0074570 | A1 | 4/2007 | Braman et al. | |
| 2007/0286435 | A1 * | 12/2007 | Sakamoto | H04R 3/04 |
| | | | | 381/87 |
| 2008/0056059 | A1 * | 3/2008 | Manera | B01F 11/0008 |
| | | | | 366/110 |
| 2008/0121779 | A1 * | 5/2008 | Ryaboy | F16F 7/1011 |
| | | | | 248/638 |
| 2009/0091410 | A1 * | 4/2009 | Leung | A61H 1/005 |
| | | | | 335/231 |
| 2010/0061007 | A1 * | 3/2010 | Matsushita | G11B 5/59627 |
| | | | | 360/68 |
| 2011/0202152 | A1 * | 8/2011 | Barton | F41B 5/14 |
| | | | | 700/91 |
| 2011/0226038 | A1 * | 9/2011 | Donahoe | F42B 6/04 |
| | | | | 73/12.05 |
| 2012/0232780 | A1 * | 9/2012 | Delson | A63F 13/06 |
| | | | | 701/400 |
| 2012/0235013 | A1 * | 9/2012 | Ryaboy | F16F 7/1011 |
| | | | | 248/550 |
| 2014/0002054 | A1 * | 1/2014 | Higashikawa | G01R 1/04 |
| | | | | 324/76.11 |
| 2014/0325999 | A1 * | 11/2014 | Hope | F25B 9/14 |
| | | | | 62/6 |
| 2015/0081110 | A1 * | 3/2015 | Houston | G05D 19/02 |
| | | | | 700/280 |
| 2016/0041068 | A1 * | 2/2016 | Wascat | G01M 99/005 |
| | | | | 702/39 |
| 2016/0144404 | A1 * | 5/2016 | Houston | B06B 1/166 |
| | | | | 318/114 |
| 2016/0258758 | A1 * | 9/2016 | Houston | G01C 21/20 |
| 2017/0054387 | A1 * | 2/2017 | Sumioka | H02M 7/523 |
| 2017/0129595 | A1 * | 5/2017 | Arce | B64C 27/001 |
| 2017/0182517 | A9 * | 6/2017 | Houston | B06B 1/166 |
| 2017/0296425 | A1 * | 10/2017 | Duan | A61H 21/00 |
| 2017/0296428 | A1 * | 10/2017 | Duan | A61H 23/02 |
| 2018/0065151 | A1 * | 3/2018 | Houston | B06B 1/166 |
| 2018/0169702 | A1 * | 6/2018 | Houston | G01C 21/20 |
| 2018/0175276 | A1 * | 6/2018 | Zeyen | G01L 1/18 |
| 2019/0028580 | A1 * | 1/2019 | Hosoi | H04M 1/00 |

OTHER PUBLICATIONS

"Active vibration control", Wikipedia, Jan. 23, 2017, pp. 12.
Barbour et al., "Intertial Instruments: Where to Now?", The Charles Stark Draper Laboratory, Inc., pp. 1-9, Massachusetts.
Brackett, et al., "Miniature vibration isolation system (MVIS)," 2000 IEEE Aerospace Conference, Proceedings (Cat. No. 00TH8484), 2000, pp. 335-344, vol. 4, Big Sky, MT, USA.
Bramen, et al., "Designing Vibration and Shock Isolation Systems for Micro Electrical Machined Based Inertial Measurement Units", Honeywell Int., pp. 1-5, Minneapolis, Minnesota.
Dagdeviren, et al, "Recent progress in flexible and stretchable piezoelectric devices for mechanical energy harvesting, sensing and actuation", Extreme Mechanics Letters, Dec. 2016, pp. 1-13, vol. 9, Part 1, Publisher: Elsevier.
Egusa, et al, "Multimaterial piezoelectric fibres", Nature Materials, Jul. 2010, pp. 1-7, Publisher: Macmillan Publishers Limited.
Moheimani, et al, "A Survey of Recent Innovations in Vibrations Damping and Control Using Shunted Piezoelectric Transducers", IEEE Transactions on Control Systems Technology, Jul. 2003, pp. 1-13, vol. 11, No. 4.
Wang, et al., "Piezoelectric fibers for sensing and actuation at ultrasonic and audio frequencies", pp. 1-29, Publisher: ISN/ARO, DARPA, NSF.
Zhou, et al., "Study on Vibration and damping of printed circuit boards treated with partial constrained damping layer", Advanced Materials Research, 2014, pp. 1-5, vols. 1049-1050, Publisher: Trans Tech Publications, Switzerland.

* cited by examiner

ACTIVELY SENSING AND CANCELLING VIBRATION IN A PRINTED CIRCUIT BOARD OR OTHER PLATFORM

SUMMARY

A subassembly or a subsystem, such as an Inertial Measurement Unit (IMU), that includes one or more component platforms, such as a printed-circuit board (PCB) or a printed-wiring board, and that is designed for use in a mobile environment (e.g., for use in vehicles such as aircraft), may experience shock-induced vibrations in one or more dimensions (shock-induced vibrations are sometimes called "shock vibrations"). For example, such a vibration-inducing shock can be caused by a bump in the road, air turbulence, maneuvering of a vehicle in which the subsystem is disposed, collision of a vehicle in which the subsystem is disposed, or a nearby explosion.

Figure 1:
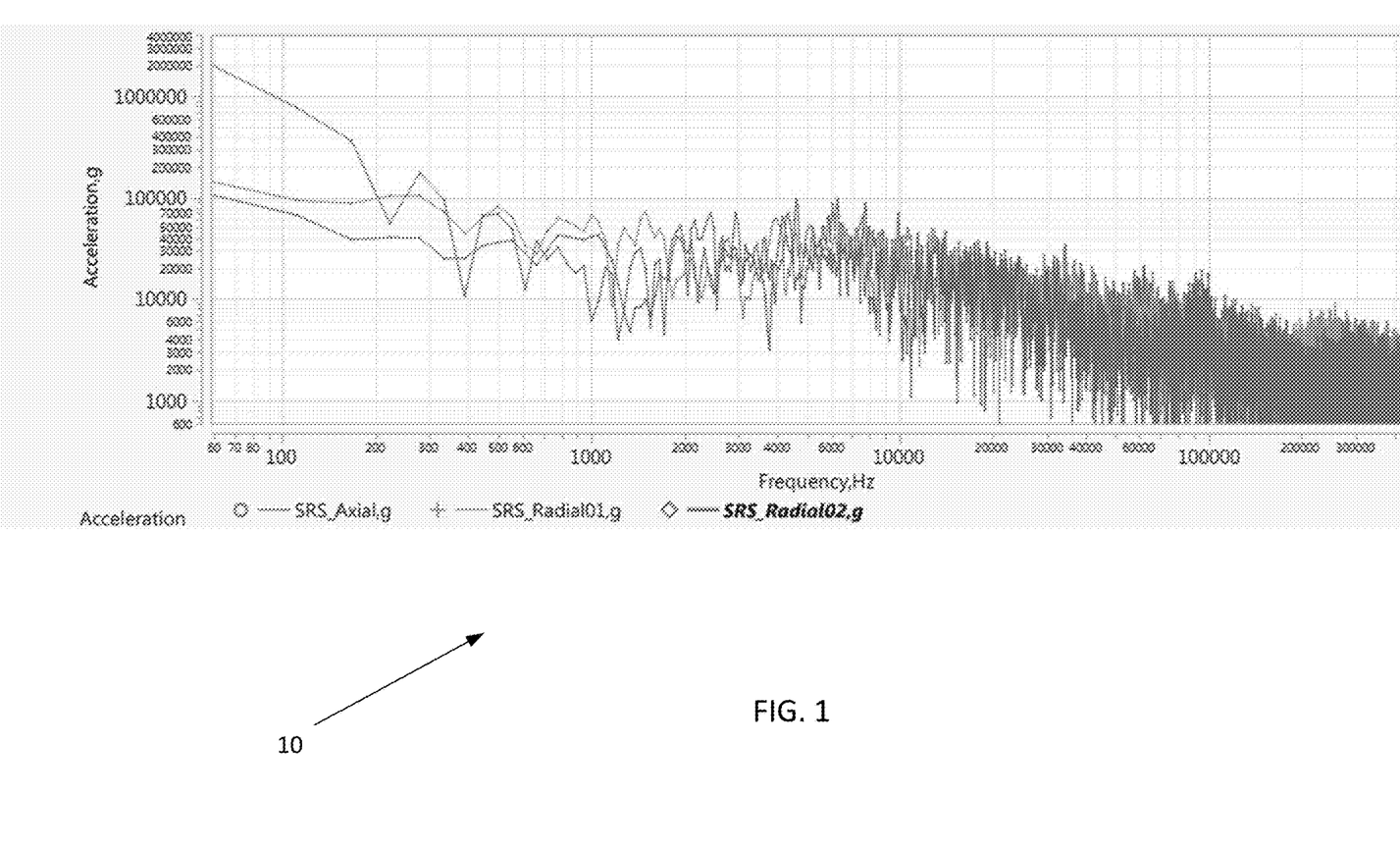
FIG. 1 is a plot of a shock response spectrum (SRS), which is a frequency spectrum of a shock-induced vibration experienced by a PCB of a subassembly such as an Inertial Measurement Unit (IMU).

FIG. 1 is a plot 10 of a portion of a frequency spectrum of shock-induced vibration experienced by a PCB of an IMU (not shown in FIG. 1). Such a shock-induced vibration can have a duration on the order of a few microseconds to a few seconds, and can have a frequency spectrum in a range that spans from a few Hertz (Hz) to hundreds of kilohertz (kHz).

A shock-induced vibration, such as plotted in FIG. 1, can temporarily contort, or otherwise deform, a PCB or other platform, and can temporarily contort, or otherwise deform, one or more components mounted to the PCB or other platform.

Unfortunately, such deformation can damage a PCB or other platform and the components mounted to the PCB or other platform. If a shock-induced vibration is powerful enough, then the deformation due to one shock may be sufficient to damage a PCB or other platform or one or more components mounted thereto. Alternatively, the cumulative effects of multiple deformations caused by multiple shock-induced vibrations may damage the PCB or other platform, or one or more components mounted thereto, over time.

Furthermore, a shock-induced vibration can introduce error into a measurement taken by, and a sense signal output by, a sensor component such as an accelerometer or a gyroscope. For example, an external vibration may give rise to a Vibration Rectification Error (VRE), which is an error that manifests as an anomalous shift in an offset of the accelerometer.

A conventional technique for reducing damage to PCBs, other platforms, and components mounted thereto is to mount the PCB/other platform to a vibration-damping, or a vibration-isolation, structure that is configured to arrest, either partially or fully, a shock-induced vibration experienced by the PCB/other platform.

Figure 2:
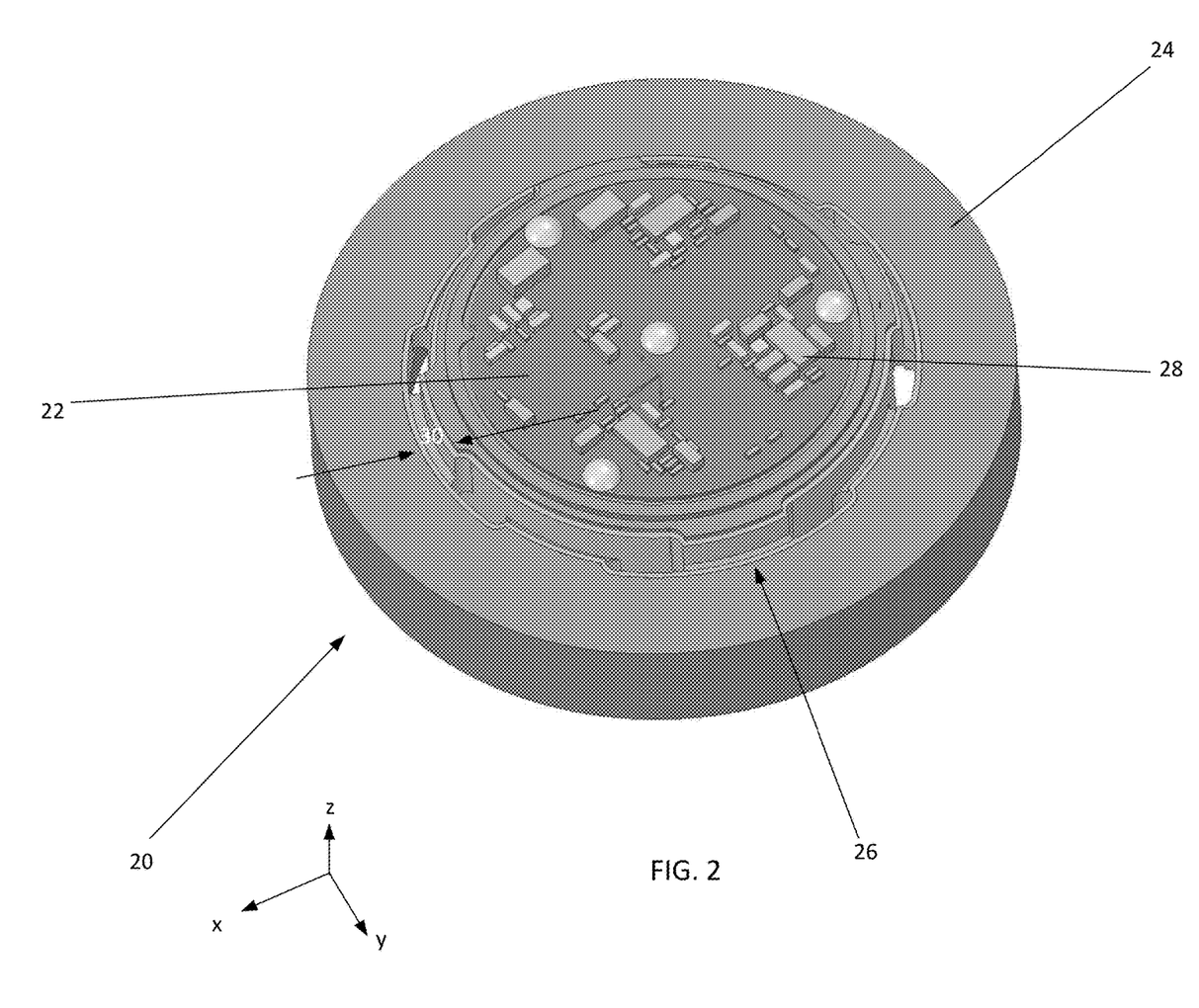
FIG. 2 is an isometric plan view of a PCB assembly that includes a PCB, a mount, and a vibration-isolation structure disposed between the PCB and the mount.

FIG. 2 is a diagram of a PCB assembly 20, which includes a PCB 22, a PCB mount 24, and a vibration-isolation structure 26 disposed between the PCB and the mount. And on the PCB 22 are mounted various circuit components 28, such as resistors, capacitors, inductors, transistors, integrated circuits such as sensors, and other components.

To damp vibrations over a wide vibration-frequency band, the combination of the PCB 22 and the isolation structure 26 is configured to have a relatively low natural frequency (i.e., a relatively large time constant) so that the isolation-structure-PCB combination resists higher-frequency vibrations while still dissipating energy imparted to the PCB by the vibrations. That is, the combination of the PCB 22 and the isolation structure 26 is configured to have a fundamental resonant mode at a frequency that is significantly lower than the anticipated frequencies of a shock-induced vibration. For example, the isolation-structure-PCB combination is configured to have a fundamental resonant mode in a natural-frequency band that starts from below, and includes, approximately 100 Hz, which corresponds to a time constant in an approximate range of 0.010 seconds and higher.

But to have a relatively low natural frequency and a relatively large time constant, the isolation structure 26 has a relatively large x-y "sway space" 30, which is a space between the PCB mount 24 within which the isolation-structure-PCB combination can sway (and rotate) in different directions within the x-y plane to dissipate energy from the shock-induced vibration. The isolation structure 26 also can be configured to allow swaying of the isolation-structure-PCB combination in the z dimension, which is the dimension normal to the surface of the PCB 22 (the z component of the sway space is not labeled in FIG. 2). Alternatively, the isolation structure 26 can be configured to allow the PCB 22 to sway only, or primarily, in the z dimension.

Unfortunately, designing the isolation structure 26 to provide a relatively large sway space increases the sizes and masses of at least the isolation structure and the mount 24; and designing the isolation-structure-PCB combination to have a relatively low natural frequency can increase the size and mass of the PCB 22 as well. And if a subsystem including the PCB assembly 20 is packaged, then designing the isolation structure 26 to provide a relatively large sway space, and designing the isolation-structure-PCB to have a relatively low natural frequency, also can increase the size and the mass of the package, and, therefore, also can increase the size and the mass of the packaged subassembly.

Still referring to FIG. 2, a conventional way to reduce the sway space, or to eliminate the isolation structure 26 altogether, is to "stiffen" the PCB 22 (e.g., by making the PCB thicker), to add a filler (e.g., a mold) between the PCB and a rigid part of the package (if the PCB assembly 20 is part of a packaged subassembly), or to both "stiffen" the PCB and to add a filler.

Unfortunately, increasing the stiffness of the PCB 22 or adding a filler also can increase the size and mass of a subsystem that incorporates the PCB assembly 20.

Yet another problem with both of the above-described techniques is that because every PCB or other platform is unique (e.g., different size, different shape, different component layout, different mass distribution, different natural frequency), a designer typically dedicates a significant amount of design time, design effort, and design resources to "shock proof" the PCB or other platform. For example, a designer typically custom designs the mount 24 and the isolation structure 26 for each different PCB 22.

Fortunately, described below are one or more embodiments of an assembly that solves one or more of the above-described problems, and that may provide additional advantages. For example, an embodiment of an assembly can be configured to isolate a PCB from a transient shock passively, actively, or by a hybrid passive-active technique.

For example, an embodiment of an assembly that solves one or more of the above-described problems is configured to cancel (partially or fully), in an active manner, vibrations experienced by a PCB or by another platform, whether the vibrations are induced by a shock or by another phenomena. The concept of actively cancelling vibrations experienced by a PCB, or by another platform, is similar to the concept of actively cancelling background noise that one might otherwise hear while he/she is listening to music with headphones in a noisy environment.

Further in example, an embodiment of such an assembly includes a platform (e.g., a PCB), a sensor, and a vibration-isolation assembly, which includes vibration-cancelling circuit and either self-sensing piezoelectric actuators or vibration sensors with vibration-cancelling actuators. The sensor is mounted to the platform and is configured to generate a sense signal that represents a vibration induced (e.g., a shock-induced vibration) of the platform. And the vibration-cancelling circuit is configured to reduce a level of the vibration in response to the sense signal. For example, the vibration-cancelling system is configured to reduce a level of a vibration induced in platform, or to eliminate the vibration altogether, by generating, in the platform, a counter vibration that has a magnitude approximately equal to a magnitude of the induced vibration and that has a phase approximately opposite to the phase of the induced vibration. That is, the counter vibration partially or fully cancels the induced vibration such that the net vibration that the platform experiences is reduced to approximately zero. Alternatively, the vibration-cancelling system is configured to reduce a level of a vibration induced in a platform by effectively stiffening at least a portion of the platform to dampen the vibration.

DETAILED DESCRIPTION

Each value, quantity, or attribute herein preceded by "substantially," "approximately," "about," a form or derivative thereof, or a similar term, encompasses a range that includes the value, quantity, or attribute ±20% of the value, quantity, or attribute, or a range that includes ±20% of a maximum difference from the value, quantity, or attribute, or ±20% of the difference between the range endpoints. For example, an "approximate" range of b–c is a range of b−20%·(c−b) to c+20%·(c−b). Furthermore, the terms "a," "an," and "the" can indicate one or more than one of the objects that they modify.

Figure 3:
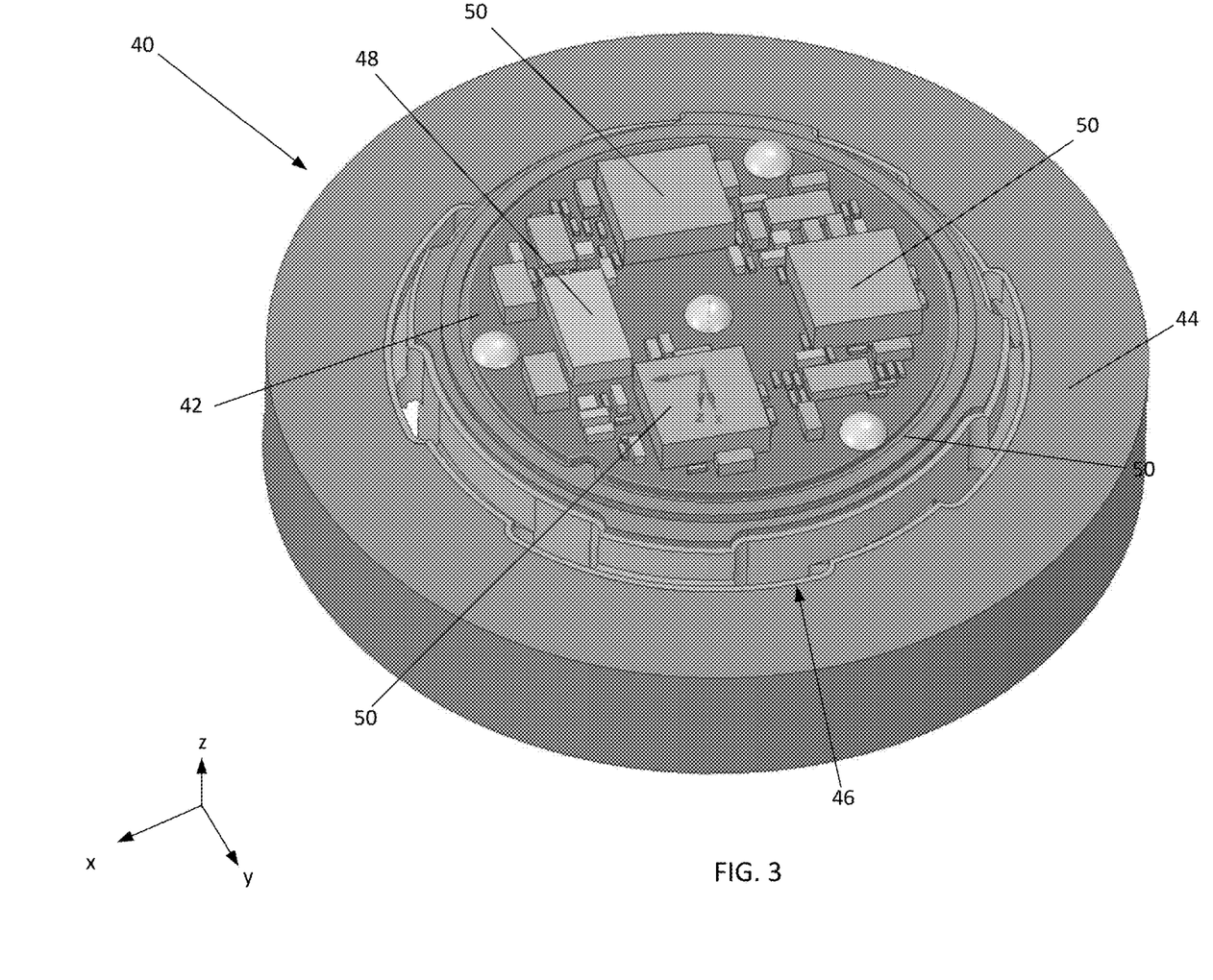
FIG. 3 is an isometric plan view of a PCB assembly equipped with active vibration cancelling, according to an embodiment.

FIG. 3 is an isometric plan view of a PCB assembly 40, which is equipped with active vibration sensing and cancelling, according to an embodiment. Actively sensing and actively cancelling vibrations, such as shock-induced vibrations, in a PCB or other platform, can reduce or eliminate negative phenomena caused by such vibrations. For example, active vibration sensing and cancelling can reduce or eliminate vibration-induced damage to a PCB and to components mounted to the PCB, and can reduce or eliminate vibration-induced error in signals output by components mounted to the PCB, such components including, for example, MEMS accelerometers and MEMS tuning fork gyroscopes (TFG). Furthermore, active vibration sensing and cancelling can allow a designer to omit a vibration-isolation structure (such as the structure 26 of FIG. 2) from the PCB assembly 40, and can allow the designer the option of not stiffening a PCB board of the PCB assembly; consequently, active vibration sensing and cancelling can allow a reduction in the size and the mass of a PCB assembly. And even for a PCB assembly including a vibration-isolation structure, active vibration sensing and cancelling can allow a reduction in the size of such a structure by, for example, allowing a reduction in the size of the sway space, and can allow a reduction in the mass of such a structure by, for example, allowing a PCB not to be stiffened.

The PCB assembly 40 includes a PCB 42, a PCB mount 44, and an optional vibration-isolation structure 46. The PCB 42 can be similar to the PCB 22 of FIG. 3, except that the PCB 42 can have a reduced level of stiffness, and thus a reduced mass, as compared to the PCB 22. The PCB mount 44 can be similar to the PCB mount 24 of FIG. 2. And the vibration-isolation structure 46 can be similar to the vibration-isolation structure 26 of FIG. 3, except that the structure 46 can have a reduced sway space, a reduced overall size, and a reduced mass as compared to the structure 26. Furthermore, although not shown in FIG. 3, the PCB assembly 40 can be disposed, partially or fully, within a package (e.g., an epoxy package) alone or with one or more other components or assemblies.

The PCB assembly 40 also includes active vibration control in the form of a vibration-sense-and-cancel circuit (for example, described below in conjunction with FIGS. 5 and 7) configured to sense and cancel, partially or fully, vibrations induced in the PCB 42 by, for example, a transient shock caused by the environment or another external phenomena. The circuit includes one or more sensors 48 (one sensor shown in FIG. 3) configured to sense vibrations in the PCB 42, and one or more actuators 50 (three shown in FIG. 3) configured to generate vibrations that together counteract, in an active manner, the sensed vibrations. The circuitry also may include self-sensing piezoelectric actuators each shunted by an external shunt damping circuit that is configured as a negative capacitance circuit (not shown in FIG. 3) configured to reduce the capacitance of the actuator in response to a shock vibration. For example, the sensors 48 can be accelerometers that are each configured to sense a respective acceleration in one, two, or three dimensions, and the one or more actuators 50 can each be a respective transducer, such as a piezoelectric transducer or a heater, that is configured to alter its shape, or the shape of the PCB 42, in response to an applied electrical control signal. In addition, one or more of the actuators 50 each can be a respective self-sensing piezoelectric actuator, which is configured to sense acceleration and to provide a response as an actuator driven by a negative capacitance circuit. Furthermore, one or more of the sensors 48 or portions thereof, or one or more of the actuators 50 or portions thereof, or one or more of the self-sensing piezoelectric actuators, can be disposed in locations other than on a same side of the PCB 42. For example, one or more of the sensors 48 or portions thereof, one or more of the actuators 50, or one or more of the sensing piezoelectric actuators or portions thereof, can be embedded inside of the PCB 42, or can be disposed on different sides of the PCB. Moreover, the vibration-sense-and-cancel circuit can include components, such as sensing actuators that are each configured to function as both a sensor 48 and an actuator 50.

The PCB assembly 40 also can include an energy harvester (which may or may not form part of the vibration-sense-and-cancel circuit, and which is not shown in FIG. 3) that operates as vibration damper to convert at least a portion of an induced vibration that the PCB 42 experiences into heat or any other kind of energy, such as into electrical energy for use by a system of which the PCB assembly 40 forms a part.

The vibration-cancellation effect also can be achieved by a method often called "piezoelectric shunt damping (PSD)," in which each of one or more self-sensing piezoelectric actuators is connected to an active external shunt circuit that is configured to control the effective elastic stiffness of the actuator.

Still referring to FIG. 3, alternate embodiments of the PCB assembly 40 are contemplated. For example, the shapes of the PCB 42, the PCB mount 44, and the vibration-isolation structure 46 can be other than round. Furthermore, although described as having components mounted to a top side (the side visible in FIG. 3) of the PCB 42, the PCB assembly 40 can include one or more components mounted to a bottom side of the PCB. Moreover, one or more of the sensors 48 and the actuators 50 can be disposed between the PCB 42 and the PCB mount 44 along the periphery of the PCB, for example, in, or forming part of, the vibration-isolation structure 46, and can be configured, respectively, for sensing and for cancelling, either partially or fully, vibrations induced in the PCB in any of three (i.e. x-y-z) dimensions. In addition, embodiments described above in conjunction with FIGS. 1-2 and below in conjunction with FIGS. 4-8 may be applicable to the PCB assembly 40 of FIG. 3.

Figure 4:
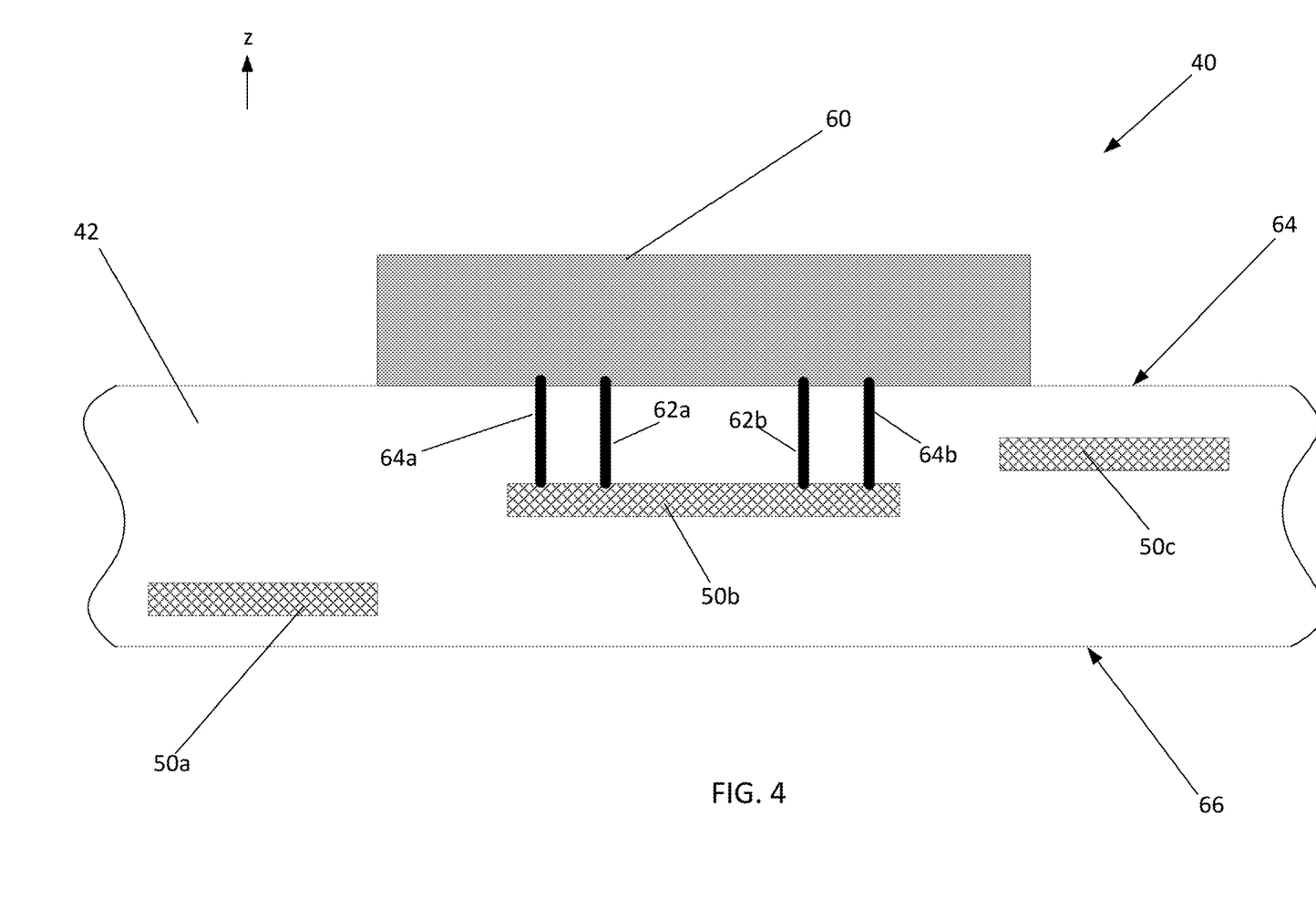
FIG. 4 is a cutaway side view of a portion of the PCB of FIG. 3, according to an embodiment.

FIG. 4 is a cutaway side view of the PCB assembly 40 of FIG. 3, according to an embodiment in which at least one of the actuators 50 is embedded, or is otherwise disposed, in the PCB 42. In FIG. 4, like reference numbers label like components common to FIGS. 3-4.

In addition to embedded actuators 50 (three embedded actuators 50*a*-50*c* are shown in FIG. 4, the PCB assembly 40 includes at least one controller 60, which is mounted to the PCB 42 and which forms part of the vibration-sense-and-cancel circuit (not shown in FIG. 4). The PCB assembly 40 also can include one more actuators 50 that are disposed on a surface of the PCB 42 such as described above in conjunction with FIG. 3.

In an embodiment in which the actuator 50*b* is, for example, a piezoelectric transducer, conductive vias 62*a* and 62*b* electrically couple the transducer 50*b* to the controller 60, which is configured to drive the transducer, by way of the vias, with an electrical control signal (e.g., a control voltage) that causes the transducer to vibrate in a manner that tends to cancel the vibration induced in the PCB 42. The other actuators 50*a*, 50*c*, and any other embedded actuator not shown in FIG. 4, can be electrically coupled to the controller 60 with respective similar vias that are not shown in FIG. 4. Furthermore, an actuator 48 disposed on an upper surface 64 of the PCB 42 can be coupled to the controller 60 by one or more conductive traces (not shown in FIG. 4) disposed on the upper surface, and an actuator disposed on a lower surface 66 of the PCB can be coupled to the controller by one or more vias and one or more corresponding conductive traces (not shown in FIG. 4) disposed on the lower surface.

And in an embodiment in which the actuator 50*b* is, for example, a piezoelectric transducer that is configured as a sensing actuator to function as both an actuator and a sensor, conductive vias 62*a* and 62*b* electrically couple a drive signal from the controller 60 to the transducer 50*b* as described above, and conductive vias 64*a* and 64*b* electrically couple a sense signal from the transducer to the controller. The piezoelectric transducer 50*b* is configured to generate, in response to a force (e.g., a vibration-induced force) that contorts the shape of the transducer from its at-rest shape or steady-state shape, a voltage having an amplitude that is proportional to the degree of deformity that the transducer experiences relative to its steady-state shape. The vias 64*a* and 64*b* are configured to couple this sense voltage from the transducer 50*b* to the controller 60, which is configured to determine the magnitude and phase of the vibration being experienced by the PCB 42 at the transducer 50*b* in response to the sense voltage. For each of the other actuators 50*a*, 50*c*, and for each of any other embedded actuator not shown in FIG. 4, that are also configured to function as vibration sensors, a respective pair of vias that are not shown in FIG. 4 can couple the respective sense signal to the controller 60. Furthermore, an actuator also configured as a sensor and disposed on the upper surface 64 of the PCB 42 can be configured to couple its sense signal to the controller 60 by way of one or more conductive traces (not shown in FIG. 4) disposed on the upper surface, and an actuator also configured as a sensor and disposed on the lower surface 66 of the PCB can be configured to couple its sense signal to the controller by way of one or more vias and one or more corresponding conductive traces (not shown in FIG. 4) disposed on the lower surface 66 of the PCB.

Still referring to FIG. 4, alternate embodiments of the PCB 40 are contemplated. For example, instead of including a single controller 60, the PCB assembly 40 may include one or more Multiple-Input-Multiple-Output (MIMO) controllers, one or multichannel controllers, or multiple controllers 60. Furthermore, the PCB assembly 40 can include one or more signal-driver circuits (not shown in FIG. 4), each configured to drive a respective actuator with a control signal from a controller. Moreover, embodiments described above in conjunction with FIGS. 1-3 and below in conjunction with FIGS. 5-8 may be applicable to the PCB assembly 40 of FIG. 4.

Figure 5:
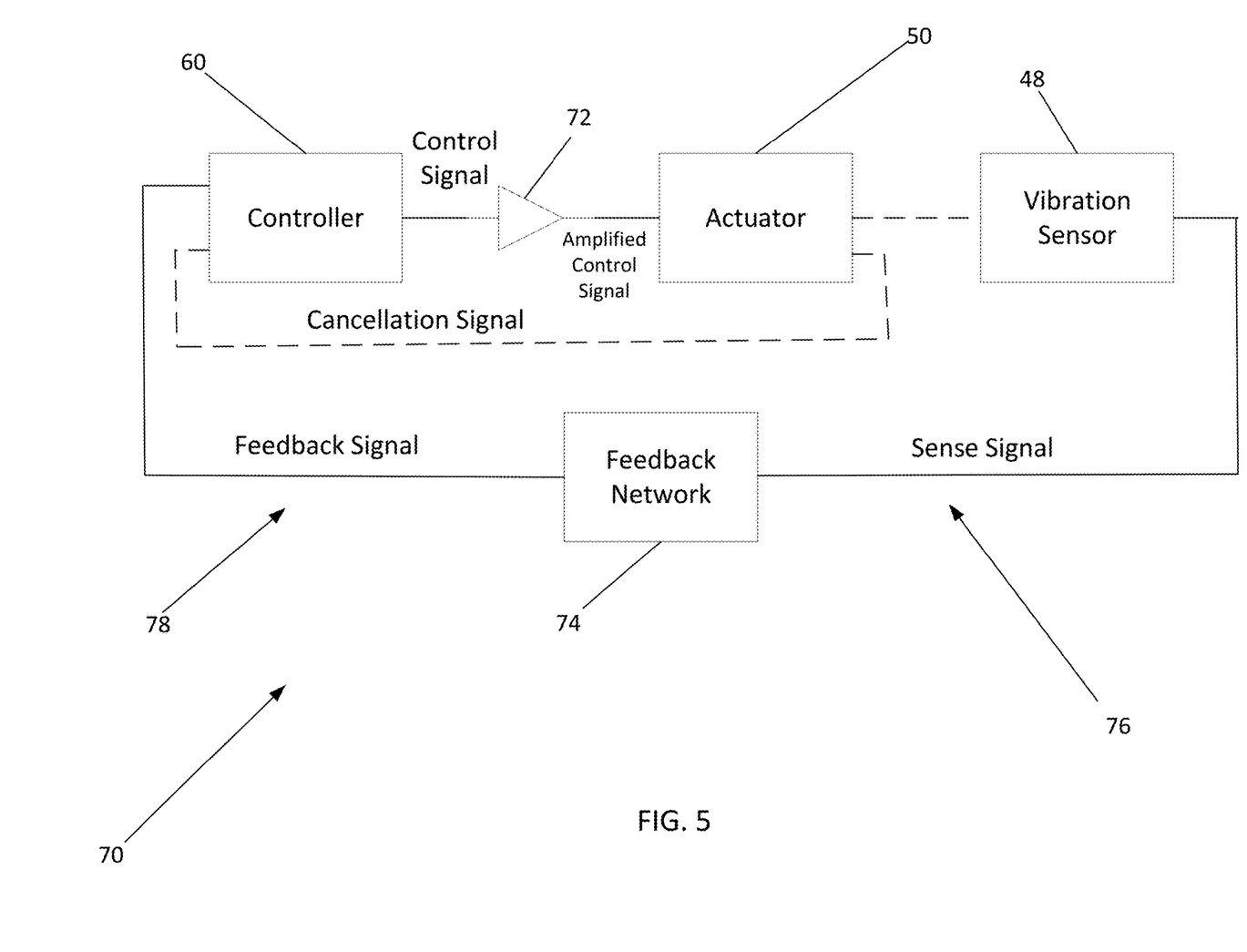
FIG. 5 is a diagram of vibration-sense-and-cancel circuit of the PCB assembly of FIGS. 3-4, according to an embodiment.

FIG. 5 is a diagram of a vibration-sense-and-cancel circuit 70 of the PCB assembly 40 of FIGS. 3-4, according to an embodiment. In FIG. 5, like reference numbers label like components common to FIGS. 3-5.

In addition to a vibration sensor 48, an actuator 50, and a controller 60, the circuit 70 includes an optional driver 72 and a feedback network 74. Furthermore, the components of the circuit 70 other than the sensor 48 can be called, collectively, a vibration-cancel circuit. For example, the actuator 50, controller 60, driver 72 (if present), and feedback network 74 together form a vibration-cancel circuit 76. Moreover, the vibration-sense-and-cancel circuit 70 forms a feedback loop 78.

As described above in conjunction with FIGS. 3-4, the vibration sensor 48 is configured to sense a vibration of the PCB 42 in a dimension (e.g., the z dimension) at the location of the sensor, and to generate an electrical sense signal that represents the sensed vibration. For example, if the sensor 48 is an accelerometer, then the sensor can be configured to generate the amplitude of the sense signal at any given time to be proportional to a sensed acceleration of the PCB 42 at the location of the sensor at the given time and in a given dimension (e.g., the z dimension). Alternatively, if the sensor 48 is a piezoelectric transducer, then the sensor can be configured to generate the amplitude of the sense signal at any given time to be proportional to a sensed displacement of the PCB 42, at the location of the sensor, from the location's steady-state position (e.g., z=0) at the given time and in a given dimension (e.g., the z dimension).

In an example in which the actuator 50 is a self-sensing piezoelectric transducer, the circuit 70 modulates the stiffness of the actuator 50 in response to the vibrations sensed by the actuator 50 itself (in this example, because the actuator 50 is self-sensing, the sensor 48 can be omitted). Hence, a vibration-cancellation effect is achieved by parametric modulation of the actuator 50 either attached to, or encapsulated in, the PCB 42 (FIG. 4). Such a noise-cancellation method is called piezoelectric shunt damping (PSD), in which a self-sensing piezoelectric actuator 50 is connected to an active external shunt circuit that controls the effective elastic stiffness of the actuator. That is, the stiffness of the actuator 50 is modulated so that the actuator effectively stiffens a local section of the PCB 42 and, therefore, changes the PCB transfer function and, as a result, reduces the vibration amplitude.

In an alternative embodiment, the actuator 50 is configured to vibrate, instead of to act as a damper, in response to a control signal from the driver 72 (or directly from the controller 60 if the driver is not present). For example, if the actuator 50 is a piezoelectric transducer, then the control signal causes a region of the transducer to be displaced by a distance (from a steady-state position of the transducer) that is proportional to the amplitude of the control signal in a dimension (e.g., the z dimension); and because the transducer is coupled to the PCB 42, the transducer displaces a corresponding location of the PCB by a distance (from a steady-state position of PCB region) that is proportional to the amplitude of the control signal and that is in the same dimension.

The controller 60 is configured to sense a feedback signal from the feedback network 74, and to drive the actuator 50 (via the driver 72 if present) in a manner that tends to reduce, toward or to zero, a magnitude of the feedback signal. Said another way, in an example in which the actuator 50 is configured to generate a cancellation vibration instead of being configured to act as a damper, the noise-cancellation approach is based on the principle of superposition, in which generated a cancelling signal has the same amplitude but opposite phase as the vibration. As a result, superimposing the cancelling vibration and the induced vibration ideally yields a net vibration of zero because these two vibrations ideally cancel each other such that the vibration sensor 48 senses zero vibration, because the induced vibration is cancelled by the actuated vibration. In another example, as shown in dashed line in FIG. 5, a cancellation signal that represents the cancelling vibration of the actuator 50 can be input to the controller 60, which is configured to add the feedback signal and the cancellation signal, and to drive the actuator so as to drive the sum of these signals to or toward zero. The sum of the cancellation and feedback signals approximately equaling zero indicates that the actuated vibration is approximately cancelling the induced vibration. Furthermore, the controller 60 can be any suitable type of control circuit, such as an analog or digital proportional-integral-derivative (PID) controller that includes one or more analog or digital error amplifiers.

Still referring to FIG. 5, the optional driver 72 can be any suitable power-amplifier circuit that is configured to boost the power of the control signal to a level that is suitable for driving the actuator 50.

And the feedback network 74 can be any suitable active or passive analog or digital circuit configured to condition the sense signal from the sensor 48 for input to the controller 60. For example, the feedback network 74 can be configured to alter the amplitude of the sense signal to be in a range specified for input to the controller 60. Furthermore, the feedback network 74 can be configured to filter the sense signal, or to add an offset voltage or current to the sense signal. For example, the feedback network 74 can be characterized by a transfer function that affects the stability of the closed-loop circuit 70, and low-pass and high-pass filters can be a part of the feedback network or otherwise can be part of the closed-loop network transfer function. For example, the feedback network 74 can be configured to include, or otherwise to function as, a low-pass filter that is configured to filter out higher-frequency components of the sense signal. Still referring to FIG. 5, alternate embodiments of the vibration-sense-and-cancel circuit 70 are contemplated. For example, although shown as including one sensor 48 and one actuator 50, the circuit 70 may include more than one sensor or more than one actuator. Furthermore, although described as including one feedback loop 78, the circuit 70 can include multiple feedback loops that are controlled by the same, or by respective, controllers 60. Moreover, although described as being configured to sense vibration and to vibrate, respectively, in a single same dimension, the sensor 48 may be configured to sense vibration in multiple dimensions, and the actuator 50 may be configured to displace the PCB 42 in multiple dimensions that may be the same as, or different than, the dimensions in which the sensor is configured to sense vibration. In addition, the PCB assembly 40 may include multiple circuits 70, one circuit per vibration sensor 48 or per actuator 50, or one circuit per dimension of the sensor 48 or actuator 50. Furthermore, the circuit 70 may include a feedforward component, or a prediction component, for better tracking of the cancel vibration generated by the actuator 50 to the actual vibration sensed by the sensor 48. Moreover, the circuit 70 can include a digital signal processor (DSP) to achieve vibration cancellation by digital active noise cancellation, which utilizes adaptive filtering of a reference signal supplied to the actuator 50. Hence, the error between the externally induced vibration and the vibration generated by the actuator 50 is driven toward or to zero by a reference signal tuned by an adaptive filter. An adaptive filter has the ability to adjust its impulse response or transfer-function to match desired system characteristics. For example, vibration cancellation can be achieved by executing a conventional Filtered-X least mean square (FXLMS) algorithm, which configures the adaptive filter to correlate the reference signal with the input signal (the signal representing the sensed vibration of the PCB 42 (FIG. 4). Moreover, embodiments described above in conjunction with FIGS. 1-4 and below in conjunction with FIGS. 6-8 may be applicable to the vibration-sense-and-cancel circuit 70 of FIG. 5.

Referring to FIGS. 3-5, operation of the vibration-sense-and-cancel circuit 70 is described, according to an embodiment in which the sensor 48 senses vibration in a single dimension (e.g., the z dimension), and the actuator 50 is configured to vibrate the PCB 42 in the same single dimension.

PCB vibration can be described as superposition of the natural modes exited by a transient signal which includes different frequencies. A Sin/Cos-like signal describes a single frequency transient signal. Cancellation signal can be generated at different locations of the PCB 42 (FIG. 4) such that the superposition of the generated signal with the externally induced vibration decreases the total vibration in one or more desired locations of the PCB.

Consequently, a vibration-cancellation device (e.g., one or more actuators 50) that can generate a distributed vibration over the PCB 42, i.e., that can generate at one or more points of the PCB, a respective vibration defined by a cancel-vibration vector that is approximately equal in magnitude yet approximately opposite in phase to the induced-vibration vector corresponding to the same point, can cancel, partially or fully, an induced vibration experienced by the PCB.

And because the vibration-cancel circuit 76 is configured to cancel vibration induced in the PCB 42 in an active manner using negative feedback, a designer need not redesign, or modify, the vibration-sense-and-cancel circuit 70 for each different version or type of PCB, except possibly to add more sensors 48 and actuators 50 to larger PCBs, and possibly to reduce the number of sensors and actuators from smaller PCBs. Consequently, including the vibration-sense-and-cancel circuit 70 as part of the PCB assembly 40 can reduce the design time of the PCB assembly significantly.

Still referring to FIGS. 3-5, in operation, the sensor 48 senses a vibration of the PCB 42 at the location of the sensor in the z dimension, and generates a sense signal that represents the profile (e.g., the magnitude, frequency, and phase) of the sensed vibration. For example, if the sensor 48 is an accelerometer, then the sensor generates a sense signal having a magnitude that represents an acceleration of the location of the PCB 42 in the z dimension as a function of time.

The feedback network 74 converts the sense signal into a feedback signal. For example, the feedback network 74 can attenuate or amplify (if the feedback network is an active network) the sense signal, can filter the sense signal (e.g., can function as a low-pass filter or a bandpass filter), and can shift the phase or the offset of the sense signal. The feedback network 74 may so modify the sense signal to prevent the loop 78 from oscillating, to render the amplitude of the feedback signal compatible with the input-voltage or input-current range of the controller 60, or to filter out noise.

The controller 60 effectively compares the feedback signal to zero, or compares the feedback signal to the cancellation signal if present, and generates the control signal to have at least one characteristic that tends to reduce the amplitude of the feedback signal toward or to zero, or to reduce the difference between the amplitudes of the feedback and cancellation signals to or toward zero. For example, because the loop 78 is a negative feedback loop, the controller 60 generates the control signal having an amplitude that causes the actuator 50 to generate a cancel vibration having a magnitude that is approximately equal to the magnitude of the induced vibration sensed by the sensor 48, and having a phase that is shifted by approximately 180° relative to the phase of the vibration sensed by the sensor.

The driver 72, if present, effectively increases the power of the control signal to a level suitable to drive the actuator 50. For example, if the actuator 50 has a relatively high input capacitance, then the driver 72 may source an output current that is high enough to drive the actuator at a given frequency and at a given slew rate.

The circuit 70 operates in the above-described manner until the magnitude of the feedback signal at least approximately equals zero, or until the difference between the magnitudes of the feedback and cancellation signals approximately equals zero.

Still referring to FIGS. 3-5, alternate embodiments of the operation of the vibration-sense-and-cancel circuit 70 are contemplated. For example, there may be one circuit 70 for each pair of a sensor 48 and an actuator 50, or a single controller 60 and feedback network 74 can be used for multiple sensor/actuator pairs. Furthermore, if the sensor 48 and actuator 50 are a same device, then the input of the feedback network 74 is coupled to a sensor-signal output of the actuator/sensor. Moreover, a single sensor 48 can be configured to measure vibration in multiple dimensions, in which case there may be a separate circuit 70 for each dimension, which means that there may be multiple circuits 70 for each sensor. Similarly, a single actuator 50 can be configured to measure vibration in multiple dimensions, in which case there may be a separate circuit 70 for each dimension, which means that there may be multiple circuits 70 for each actuator. In addition, instead of receiving a sense signal from a vibration sensor 48, the feedback network 74 may receive an error signal from a measurement component, such as a MEMS tuning fork gyroscope (TFG), such that the circuit operates to reduce an error in a signal generated by the measurement component. Furthermore, instead of operating in a closed-loop mode, the circuit 70 can be configured to operate in an open-loop mode. For example, the circuit 70 may include an amplifier that receives the sense signal from the sensor 48, that inverts and optionally amplifies the sense signal, and that drives the actuator 50 with the inverted and optionally amplified signal such that the actuator generates a vibration that is, at least ideally, equal in magnitude and opposite in phase to the vibration that the sensor sensed.

Figure 6:
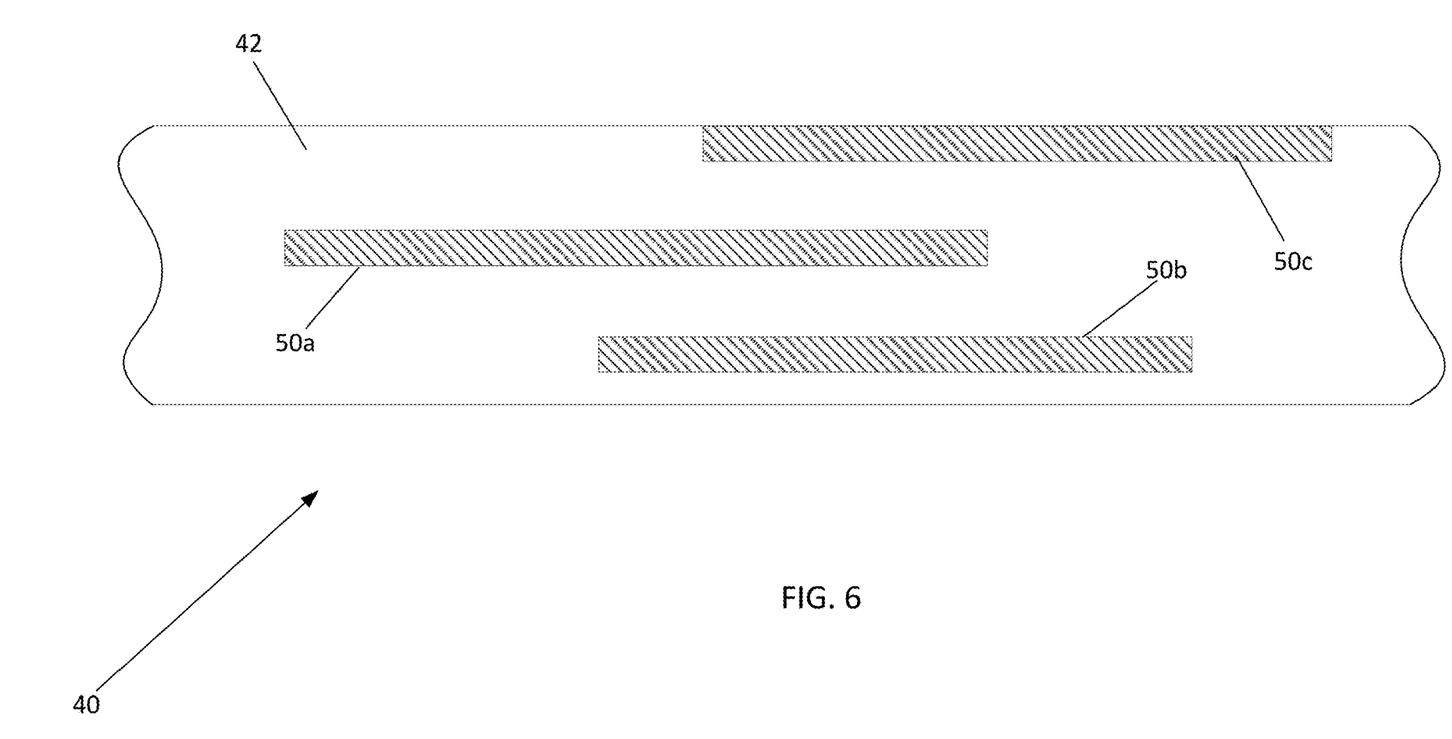
FIG. 6 is a cutaway side view of a portion of the PCB of FIG. 3, according to another embodiment.

FIG. 6 is a cutaway side view of a portion of the PCB assembly 40 of FIG. 3, according to an embodiment in which at least one of the actuators 50 is embedded, or is otherwise disposed, in the PCB 42, and in which the actuators are heat elements such as resistors that generate heat in response to conducting an electric current.

Each of the heat elements 50a-50c can be coupled to the controller 60 (FIG. 5) with respective vias (not shown in FIG. 6) in a manner similar to that described above in conjunction with FIG. 4.

In an embodiment, the controller 60 (FIG. 5) is configured to drive each of the heat elements 50, by way of the vias (not shown in FIG. 6), with a respective electrical control signal (e.g., a control current) that causes the heat element to vibrate the PCB 42 in a manner that tends to cancel a vibration induced in the PCB (e.g., a shock-induced vibration). In response to being activated, a heat element 50 heats a location of the PCB 42 at which the heat element is located, and the heat contorts the shape of the PCB at the location. For example, the heat may cause the PCB 42 to bend or bow at the location. And in response to the heat element 50 being deactivated, the location of the PCB 42 cools and returns to its steady-state shape. If the heat-conduction time constant of the heating element 50 and the location of the PCB 42 is small enough, then the controller 60 can control the heating element so that the location of the PCB 42 vibrates in a manner that partially or fully cancels a vibration induced at the location (and possibly at other locations) of the PCB as described above in conjunction with FIGS. 3-5.

In another embodiment, the controller 60 (FIG. 5) is configured to drive each of the heat elements 50, by way of the vias (not shown in FIG. 6), with a respective electrical control signal (e.g., a control current) that activates the heat element to cause the PCB 42 to withstand a vibration induced in the PCB. For example, suppose a shock-induced force is applied in the −z direction to a location of the PCB 42 at which the heat element 50 is located (or to a location near the heat element). The control 60 is configured to apply, to the heat element 50, a control signal that causes the heat element to generate heat, which, in turn, causes the location of the PCB 42 to bend in the −z dimension such that the peak of the bend is the highest point of the location along the z axis. The bend distributes the shock-induced force over a larger area of the PCB 42 much like an arch over a door or window distributes force from the center of the door/window to the sides of the door/window. Viewed another way, the bend effectively stiffens the PCB 42 to dampen down the induced vibration. The result of the heat-induced bend is that the PCB 42 is better able to withstand the shock-induced force, and, therefore, to better withstand any accompanying shock-induced vibration. In response to a sensor 48 (FIG. 5) sensing that the force or vibration has dissipated, the controller 60 deactivates the heat element 50; in response to the deactivation of the heat element, the location of the PCB 42 cools and returns to its steady-state shape.

Still referring to FIG. 6, alternate embodiments of the PCB assembly 40 and the heat elements 50 are contemplated. For example, one or more heat elements 50 can have orientations (e.g., extending lengthwise in the z dimension) other than the orientations shown in FIG. 6. Furthermore, the PCB 42 can include one or more heat elements 50, and one or more other types of actuators 50 (e.g., piezoelectric transducers, sensor/actuator combinations). Moreover, embodiments described above in conjunction with FIGS. 1-5 and below in conjunction with FIGS. 7-8 may be applicable to the PCB assembly 40 and heating elements 50 of FIG. 6.

Referring to FIGS. 3-6, in another embodiment, each of one or more of the actuators 50 can be replaced with a respective energy-harvesting component. The control circuit 60 can generate the control signal to adjust the stiffness of the energy-harvesting component as described above to reduce vibration of the PCB 42. And the energy-harvesting component can dampen the vibration by converting at least a portion of the vibration energy into another form of energy such as electrical energy that can be used by one or more circuits on the PCB 42. And the PCB 42 can include one or more circuits to convert electrical energy harvested by the energy-harvesting component into one or more voltages suitable to power the one or more circuits.

Figure 7:
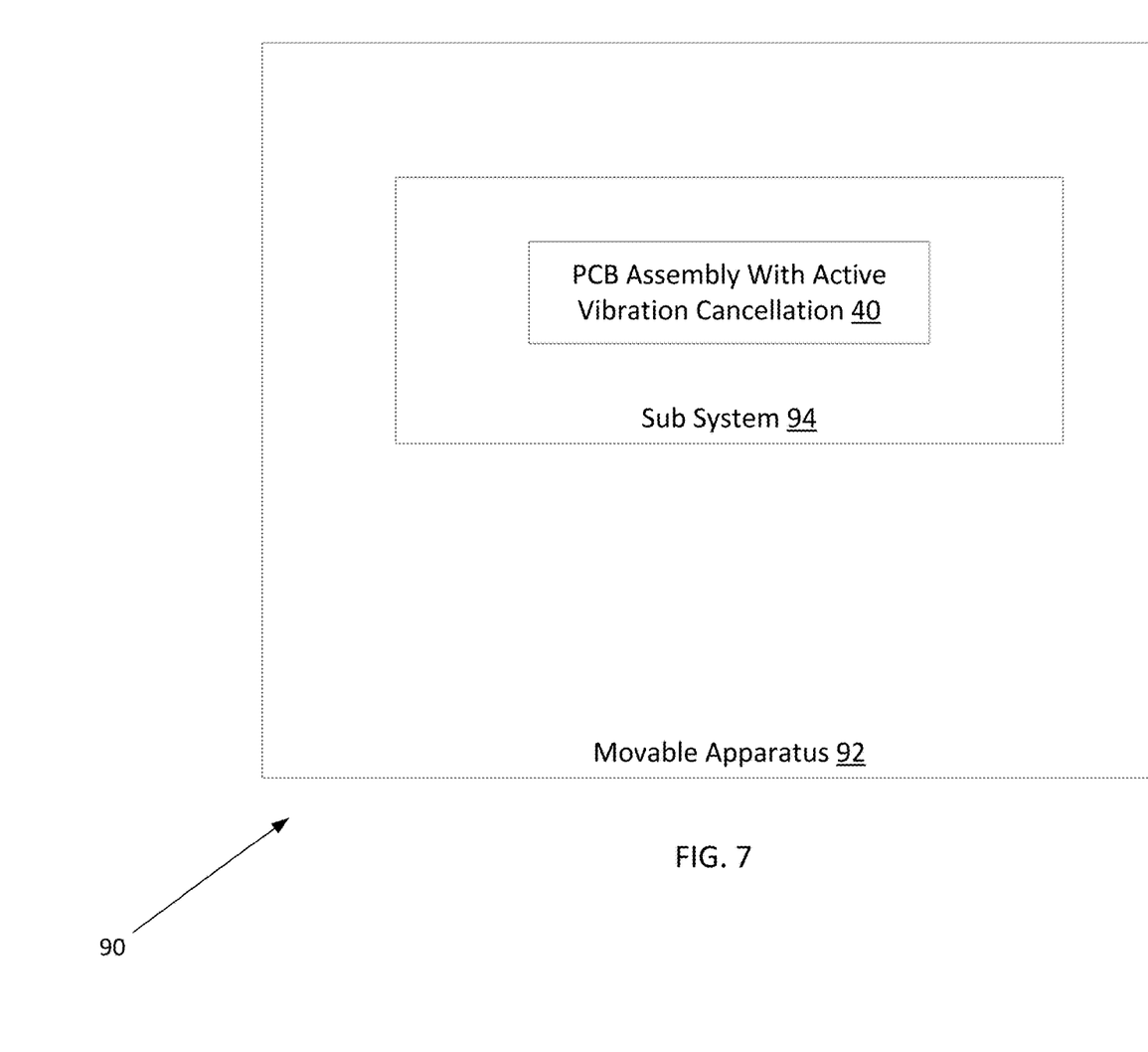
FIG. 7 is a diagram of a system that includes at least one of the PCB assembly of FIGS. 3-4, according to an embodiment.

FIG. 7 is a diagram of a system 90, which incorporates one or more PCB assemblies 40 (FIG. 3), or one or more other platform assemblies with active vibration cancellation, according to an embodiment. For purposes of example, the system 90 is described as including one PCB assembly 40, it being understood that the description is similar if the system includes more than one PCB assembly 40, or includes one or more other platform assemblies equipped with active vibration cancellation.

The system 90 includes a movable apparatus 92, a subsystem 94 disposed on the movable apparatus, and a PCB assembly 40 disposed on the subsystem.

The movable apparatus 92 can be a vehicle such as an aircraft, watercraft, land craft, spacecraft, drone, or any other movable object or any other object subject to vibration. For example, the apparatus 92 can be apparatus, such as a washing machine, that vibrates during normal operation, even in the absence of a shock vibration or other externally induced vibration.

The subsystem 94 can be any suitable subsystem such as a navigation or flight-management subsystem that includes an inertial measurement unit (IMU), a communication subsystem, a steering subsystem, or a propulsion subsystem.

And the PCB assembly 40 can be, can include, or can form a part of any suitable component such as a measurement component that is configured to measure a physical quantity such as linear or angular acceleration (e.g., a CVG), and that is configured to generate a sense signal that represents the measured physical quantity.

Still referring to FIG. 7, alternate embodiments of the system 90 are contemplated. For example, one or more embodiments described above in conjunction with FIGS. 1-7 may be applicable to the system 90.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, the circuit components described above may be disposed on a single or multiple integrated-circuit (IC), a digital signal processor (DSP), a filter and detect (FAD) circuit, integrated-photonic (IP) dies, or radio-frequency-over-glass (RFOG) dies to form one or more ICs/IPs/RFOGs/DSP/FAD, where these one or more ICs/IPs/RFOGs/DSP/FAD may be coupled to one or more other ICs/IPs/RFOGs/DSP/FAD. Furthermore, one or more components of a described apparatus or system may have been omitted from the description for clarity or another reason. Moreover, one or more components of a described apparatus or system that have been included in the description may be omitted from the apparatus or system.

EXAMPLE EMBODIMENTS

Example 1 includes an apparatus, comprising: a platform; a sensor mounted to the platform and configured to generate a sense signal that represents a vibration of the platform; and a vibration-cancel circuit configured to reduce a level of the vibration in response to the sense signal.

Example 2 includes the apparatus of Example 1, further comprising: wherein the platform includes a printed circuit board; and at least one component other than the sensor and the vibration-reducing circuit mounted to the platform.

Example 3 includes the apparatus of any of Examples 1-2 wherein the sensor includes an accelerometer.

Example 4 includes the apparatus of any of Examples 1-3 wherein the sensor includes an actuator.

Example 5 includes the apparatus of any of Examples 1-4 wherein the sensor includes a self-sensing piezoelectric actuator.

Example 6 includes the apparatus of any of Examples 1-5 wherein the sensor is disposed over a surface of the platform.

Example 7 includes the apparatus of any of Examples 1-6 wherein the sensor is disposed at least partially within the platform.

Example 8 includes the apparatus of any of Examples 1-7 wherein the vibration-cancel circuit includes: a controller circuit configured to generate a control signal in response to a feedback signal that is related to the sense signal; and an electronically controllable structure configured to reduce the level of the vibration in response to the control signal.

Example 9 includes the apparatus of any of Examples 1-8 wherein the vibration-cancel circuit includes: a controller circuit configured to generate a control signal in response to a feedback signal that is related to the sense signal; and an electronically controllable structure configured to reduce the level of the vibration, as represented by the sense signal, in response to the control signal.

Example 10 includes the apparatus of any of Examples 1-9 wherein the vibration-cancel circuit includes: a controller circuit configured to generate a control signal in response to a feedback signal that is related to the sense signal; and an electronically controllable structure configured to reduce the level of the vibration, as represented by the feedback signal, in response to the control signal.

Example 11 includes the apparatus of any of Examples 1-10 wherein the vibration-cancel circuit includes a self-sensing piezoelectric actuator coupled to an active external shunt circuit that is configured to control the effective elastic stiffness of the actuator.

Example 12 includes the apparatus of any of Examples 1-11 wherein the vibration-cancel circuit includes: a controller circuit configured to compare a cancellation signal that is related to a cancellation vibration generated in response to the vibration-cancel signal to a feedback signal that is related to the sense signal, and to generate a control signal in response to the comparison; and an electronically controllable structure configured to reduce the level of the vibration in response to the control signal.

Example 13 includes the apparatus of any of Examples 1-12 wherein the vibration-cancel circuit includes: a controller circuit configured to generate a control signal in response to a feedback signal that is related to the sense signal; and a transducer configured to vibrate in response to the control signal and in a manner that at least partially cancels the vibration of the platform.

Example 14 includes the apparatus of any of Examples 1-13 wherein the vibration-cancel circuit includes: a controller circuit configured to generate a control signal in response to a feedback signal that is related to the sense signal; and the sensor configured to vibrate in response to the control signal and in a manner that at least partially cancels the vibration of the platform.

Example 15 includes the apparatus of any of Examples 1-14 wherein the vibration-cancel circuit includes: a controller circuit configured to generate a control signal in response to a feedback signal that is related to the sense signal; and a heater configured to change a shape of the platform in response to the control signal, the change in shape configured to counteract, at least partially, the vibration of the platform.

Example 16 includes the apparatus of any of Examples 1-15 wherein the vibration-cancel circuit includes: a controller circuit configured to generate a control signal, and to vary the control signal in response to a feedback signal that is related to the sense signal so as to cause the feedback signal to dither around a minimum value; and an electronically controllable structure configured to cancel, at least partially, the vibration of the platform in response to the control signal.

Example 17 includes a system, comprising: a vehicle; a subsystem disposed on the vehicle, the subsystem including a platform, a sensor mounted to the platform and configured to generate a sense signal that represents a vibration of the platform, and a vibration-cancel circuit configured to reduce a level of the vibration in response to the sense signal.

Example 18 includes the system of Example 17, further comprising: wherein the subsystem includes a navigation subsystem; and a gyroscope mounted to the platform.

Example 19 includes a method, comprising: sensing a vibration of a platform; and displacing the platform in response to the sensed vibration and in a manner that counteracts, at least partially, a displacement of the platform caused by the vibration.

Example 20 includes the method of any of Example 19 wherein displacing the platform includes inducing, in the platform, a counteracting vibration that is out of phase with the vibration of the platform.

Example 21 includes the method of any of Examples 19-20 wherein displacing the platform includes inducing, in the platform, a bend that dampens the vibration.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An apparatus, comprising:
   a platform;
   a sensor mounted to the platform and configured to generate a sense signal that represents a first vibration of the platform; and
   a vibration-cancel circuit configured to reduce a level of the first vibration by generating in response to the sense signal, a second vibration in the platform.

2. The apparatus of claim 1, further comprising:
   wherein the platform includes a printed circuit board; and
   at least one component other than the sensor and the vibration-reducing circuit mounted to the platform.

3. The apparatus of claim 1 wherein the sensor includes an accelerometer.

4. The apparatus of claim 1 wherein the sensor includes an actuator.

5. The apparatus of claim 1 wherein the sensor includes a self-sensing piezoelectric actuator.

6. The apparatus of claim 1 wherein the sensor is disposed over a surface of the platform.

7. The apparatus of claim 1 wherein the sensor is disposed at least partially within the platform.

8. The apparatus of claim 1 wherein the vibration-cancel circuit includes:
   a controller circuit configured to generate a control signal in response to a feedback signal that is related to the sense signal; and
   an electronically controllable structure configured to reduce the level of the first vibration by generating the second vibration in response to the control signal.

9. The apparatus of claim 1 wherein the vibration-cancel circuit includes:
   a controller circuit configured to generate a control signal in response to a feedback signal that is related to the sense signal; and
   an electronically controllable structure configured to reduce the level of the first vibration, as represented by the sense signal, by generating the second vibration in response to the control signal.

10. The apparatus of claim 1 wherein the vibration-cancel circuit includes:
    a controller circuit configured to generate a control signal in response to a feedback signal that is related to the sense signal; and
    an electronically controllable structure configured to reduce the level of the first vibration, as represented by the feedback signal, by generating the second vibration in response to the control signal.

11. The apparatus of claim 1 wherein the vibration-cancel circuit includes:
    a controller circuit configured to compare a cancellation signal that is related to a second vibration to a feedback signal that is related to the sense signal, and to generate a control signal in response to the comparison; and an electronically controllable structure configured to reduce the level of the first vibration by generating the second vibration in response to the control signal.

12. The apparatus of claim 1 wherein the vibration-cancel circuit includes:
   a controller circuit configured to generate a control signal in response to a feedback signal that is related to the sense signal; and
   a transducer configured to generate the second vibration in response to the control signal and in a manner that at least partially cancels the first vibration of the platform.

13. The apparatus of claim 1 wherein the vibration-cancel circuit includes:
   a controller circuit configured to generate a control signal in response to a feedback signal that is related to the sense signal; and
   the sensor configured to generate the second vibration in response to the control signal and in a manner that at least partially cancels the first vibration of the platform.

14. The apparatus of claim 1 wherein the vibration-cancel circuit includes:
   a controller circuit configured
      to generate a control signal, and
      to vary the control signal in response to a feedback signal that is related to the sense signal so as to cause the feedback signal to dither around a minimum value; and
   an electronically controllable structure configured to cancel, at least partially, the vibration of the platform by generating the second vibration in response to the control signal.

15. An apparatus, comprising:
a platform;
a sensor mounted to the platform and configured to generate a sense signal that represents a vibration of the platform; and
a vibration-cancel circuit configured to reduce a level of the vibration in response to the sense signal;
wherein the vibration-cancel circuit includes a self-sensing piezoelectric actuator coupled to an active external shunt circuit that is configured to control the effective elastic stiffness of the actuator.

16. An apparatus, comprising:
a platform;
a sensor mounted to the platform and configured to generate a sense signal that represents a vibration of the platform; and
a vibration-cancel circuit configured to reduce a level of the vibration in response to the sense signal, the vibration-cancel circuit including
   a controller circuit configured to generate a control signal in response to a feedback signal that is related to the sense signal, and
   a heater configured to change a shape of the platform in response to the control signal, the change in shape configured to counteract, at least partially, the vibration of the platform.

17. A system, comprising:
a vehicle;
a subsystem disposed on the vehicle, the subsystem including
   a platform,
   a sensor mounted to the platform and configured to generate a sense signal that represents a first vibration of the platform, and
   a vibration-cancel circuit configured to reduce a level of the first vibration by generating, in response to the sense signal, a second vibration in the platform.

18. The system of claim 17, further comprising:
wherein the subsystem includes a navigation subsystem; and
a gyroscope mounted to the platform.

* * * * *